United States Patent [19]

Corey

[11] Patent Number: 4,491,744
[45] Date of Patent: Jan. 1, 1985

[54] CURRENT SOURCE DIRECT BASE DRIVE FOR TRANSISTOR POWER SWITCHES

[75] Inventor: Philip D. Corey, San Diego, Calif.

[73] Assignee: Burroughs Corporation, Detroit, Mich.

[21] Appl. No.: 561,140

[22] Filed: Dec. 14, 1983

Related U.S. Application Data

[63] Continuation of Ser. No. 404,114, Aug. 2, 1982, and Ser. No. 121,063, Feb. 13, 1980, abandoned.

[51] Int. Cl.³ .......................... H03K 3/26; H03K 17/60
[52] U.S. Cl. .................................. 307/270; 307/255; 307/300; 307/571
[58] Field of Search ............... 307/300, 270, 253, 254, 307/255, 571

[56] References Cited

U.S. PATENT DOCUMENTS

| | | | |
|---|---|---|---|
| 2,982,868 | 5/1961 | Emile, Jr. | 307/253 |
| 3,152,265 | 10/1964 | Mekel | 307/300 |
| 3,735,151 | 5/1973 | Frederiksen et al. | 307/270 |
| 4,093,925 | 6/1978 | Yokoyama | 307/270 |
| 4,166,964 | 9/1979 | Ahmed | 307/270 |
| 4,318,011 | 3/1982 | Zeis | 307/255 |

FOREIGN PATENT DOCUMENTS 522159  1/1977  Japan ................ 307/253

OTHER PUBLICATIONS

Electronic Design, "Precision Voltage Comparator Has Low Power Supply Drain," Sep. 20, 1970, p. 65.

Primary Examiner—Stanley D. Miller
Assistant Examiner—B. P. Davis
Attorney, Agent, or Firm—Mark T. Starr; David G. Rasmussen; Kevin R. Peterson

[57] ABSTRACT

An improved driver circuit for transistor power switches, which allows operation of the power transistor at high output power and at a duty range from zero to 100 percent without the previously large switching losses. This new driver circuit uses a constant current source which forces base current into the power transistor.

5 Claims, 10 Drawing Figures

CURRENT SOURCE DIRECT BASE DRIVE FOR TRANSISTOR POWER SWITCHES

This application is a continuation of application Ser. No. 404,114 filed Aug. 2, 1982 and U.S. Ser. No. 121,063 filed Feb. 13, 1980, abandoned.

BACKGROUND OF THE INVENTION

1. Field of the Invention

The present invention relates in general to power transistors operated in a switching mode, and more specifically, to a direct base drive circuit used to drive power transistors.

2. Description of the Prior Art

It has long been common practice to operate power transistors in a nonlinear mode as on-off switches. Commercial use for such transistor power switches has, for example, found successful application in power conversion systems.

Of key importance in the operation of transistor power switches in the base drive circuit, which drives the transistor into its "off" or "on" state. Base drive circuits, which are common in the prior art, are of two types: transformer coupling; and direct base drive, in which a transformless coupling is used.

The transformer coupling is limited to applications which only require operation over a limited or substantially fixed range of duty cycle. Duty cycle is defined as the fractional ratio of the time period during which the output power switch is "on", to the total time period for the repetitive on-off cycle. Since magnetic coupling devices require operation with alternations of equal volt-second wave form areas, a transformer coupled base drive circuit experiences saturation effects and consequently a collapse of drive signals at duty cycle extremes. This precludes application of transformer-coupled base drive circuits in, for example, "boost regulator" circuits which require a duty cycle operation of from zero to 80 percent.

High performance "transformerless" direct base drive circuits are known in the art and are not subject to duty cycle restrictions. They are, however, limited to applications which do not require high output power levels. Direct base drive circuits, which are known in the art, drive the power transistor from a normal voltage source. Such voltage source drive circuits produce unfavorably large "turn-on" switching losses at high output power levels, due to their inability to deliver and maintain a high level of base current with adequate fast rise time during the switch "on" event. The rate of rise of base current drive, which can be produced by a voltage source, is limited by circuit inductances and load current reaction resulting from the power transistor output current. This detrimental turn "on" switching loss is experienced for output power levels of 1 kilowatt or greater.

SUMMARY OF THE INVENTION

The object of this invention is to correct deficiencies in base drive capacity, experienced with the prior art, in an efficient and economic manner. To accomplish this a *current source* base drive circuit was sucessfully devised.

The novel feature of the present invention resides in the use of a constant current source which *forces* base drive current into the power transistor regardless of the above-described transient effects caused by unwanted base drive circuit stray inductances or fast rising load currents. Abrupt switching of the power transistor is accomplished by "steering" the current from the constant current source into the base of the power transistor for the "on" mode and through a reversed-biased voltage source for "off" mode.

Another novel feature is the modulation of the current source such that the current driven to the base of the power transistor is at an amplitude sufficient to keep the power transistor in saturation, but not to overdrive it. This results in increased efficiency and faster switching.

DETAILED DESCRIPTION OF THE PREFERRED EMBODIMENT

Figure 1:
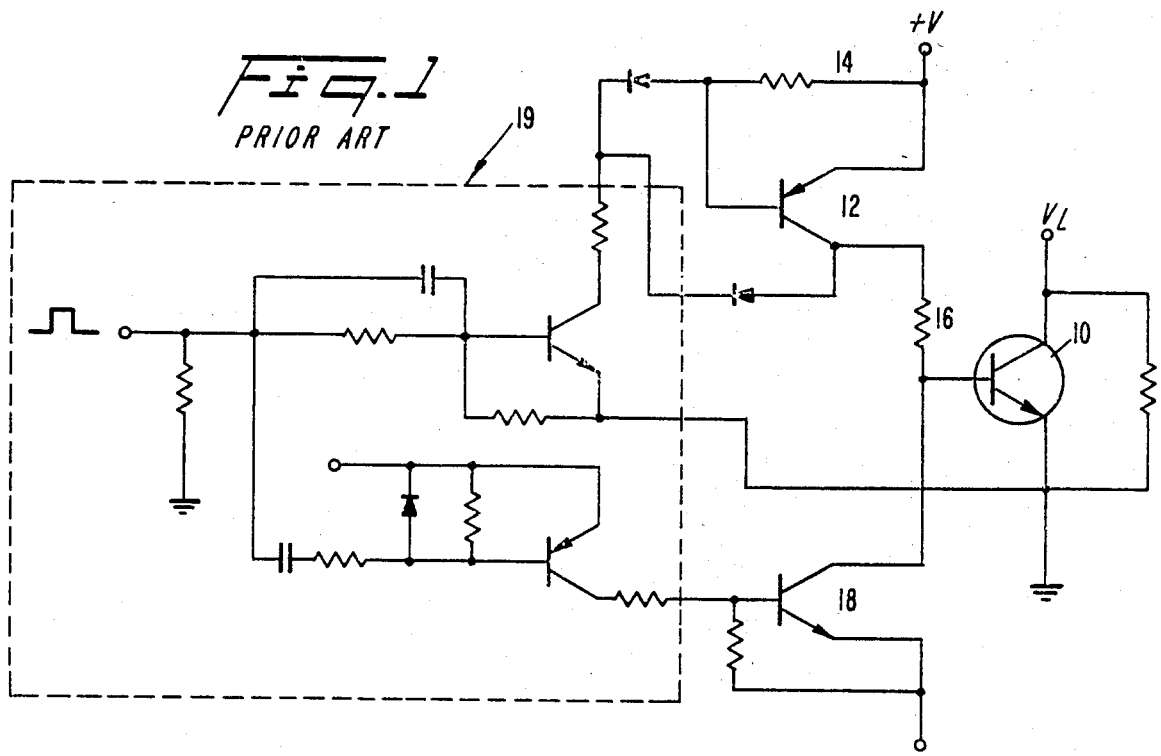
FIG. 1 is a schematic of a voltage source direct base drive which is representative of the prior art.

A typical transformerless direct base drive circuit, known in the prior art, is shown in FIG. 1. The power transistor 10 is switched abruptly "on" by "turning-on" transistor 12, which acts as an "on-off" switch. With transistor 12 "on" base drive is supplied to the power transistor from the positive voltage source 14 through the limiting resister 16. The output transistor 10 is, thus, driven from a normal voltage source 14 with the rate of rise of the base drive current to the power transistor 10 bucked by circuit inductances and load reaction caused by the output current in the emitter ground power connection. The power transistor is switched "off" by using switching circuit 19 to simultaneously switch transistor 12 "off" and Transistor 18 "on" thereby abruptly reverse biasing the power transistor, switching it into the "off" condition.

Figure 2:
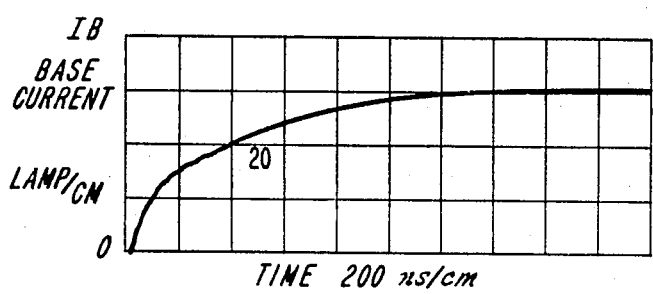
FIG. 2 is a diagrammatic representation of the base drive current "turn-on" response when a voltage source drive, known in the prior art, is used and low output power is required.
Figure 3:
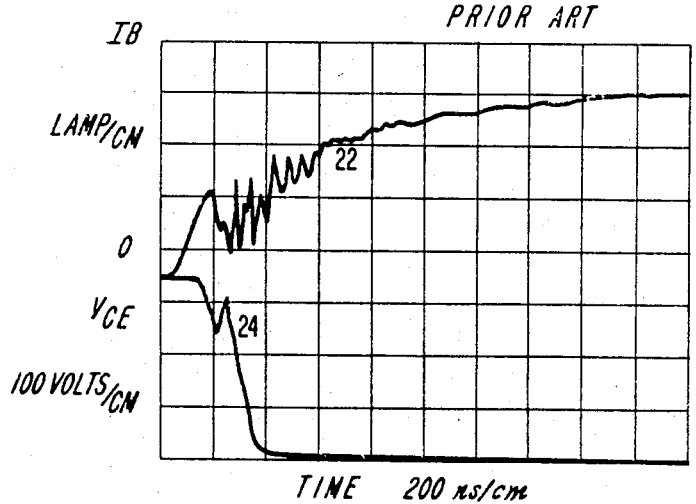
FIG. 3 is a diagrammatic representation of base drive current and collector-emitter voltage during "turn-on" response when the prior art voltage source drive is used and an output of approximately 1 kw is required.

The above-mentioned circuit inductances and load current reaction resists the rise of needed base current during turn-on, just the instant in time that base drive is needed. FIGS. 2 and 3 show the diagrammatic effect load current amplitude has on switching performance when the prior art voltage source drive is used. These figures show base drive current and collector-emitter voltage actually measured on the prior art drive circuit. Curve 20 shows base current versus time, with the condition of essentially zero power in the output collector-emitter circuit of the power transistor. As the load current increases, the rapid rise time, shown in curve 20, deteriorates. Curve 22 shows base current versus time when appreciable power, approximately 1 kw power, is permitted to flow in the output circuit. The effect of the rapid rise in output load current, as the power transistor attempts to turn "on", induces base-emitter voltages which buck the base drive current (curve 22; note that the rise of base current is arrested and, in fact, reduced back to nearly zero for a transient time interval. Curve 24 shows collector-emitter voltage when appreciable power flows in the output circuit (1 kw). It can be seen from curve 24 that collector-emitter voltage starts to fall rapidly and then actually rises again in response to the undesired base current perturbation before finally dropping to nearly zero as the output transistor finally attains the "on" conducting state. During the "turn-on" transient appreciable switching loss occurs, as a result of this "hesitation" in the collector-emitter voltage fall characteristic. This collector-emitter voltage "hesitation" is the direct result of the inability of the voltage source drive method used in the prior art, to deliver and maintain a high level of turn on drive during the "switch-on" event.

Figure 4:
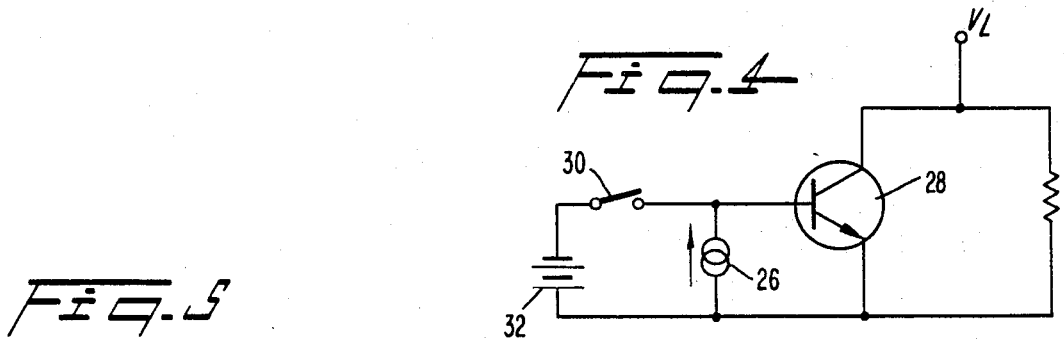
FIG. 4 is a schematic of an equivalent circuit for a *current source* base driver.

The invention remedies this collector-emitter voltage "hesitation" by using a *constant current* drive which *forces* current into the base of the power transistor regardless of the transient effects of fast rising load currents. FIG. 4 shows the equivalent circuit for this new direct base drive. The constant current source 26 *forces* base current into the power transistor 28 regardless of the above-discussed transient effects. Switching the power transistor 28 "off" is accomplished by "steering" the current from the constant current source 26 through a reverse-bias voltage source 32. This provides a path for the drive current during the "off" mode and also any reverse "junction-clearing" current which can naturally flow out of the power transistor base. In the equivalent circuit the "steering" is accomplished by switch 30.

Figure 5:
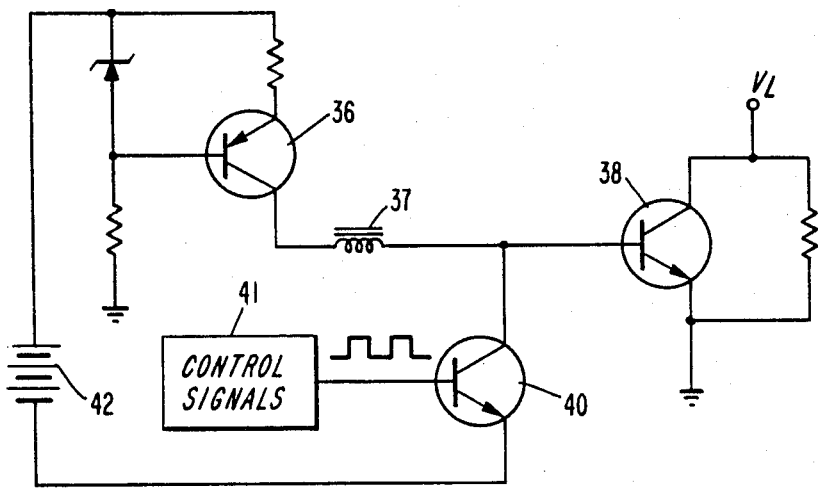
FIG. 5 is a schematic of the *constant current source* base drive circuit.

A simplified schematic of the constant current source base drive is shown in FIG. 5. The PNP transistor 36 acts as a simple current source and supplies constant current. The constant current capabilities of the circuit are further enhanced by the inclusion of a base drive inductor 37. This inductor permits the "on" drive to be supplied from a low voltage positive source through a "slow" low-cost transistor operating as a constant current source. This inductor forces base current into the power transistor 38 despite base-emitter voltage reaction, thus, providing extremely high compliance. The NPN transistor 40 provides the functional equivalent of the switch 30 in FIG. 4, receiving square wave control signals 41 which drive it into "on" or "off" states. It thus steers the base drive current into the power transistor 38, for turn "on", or into the negative side of the low voltage power source 41 for reverse biasing and turn "off".

Figure 6:
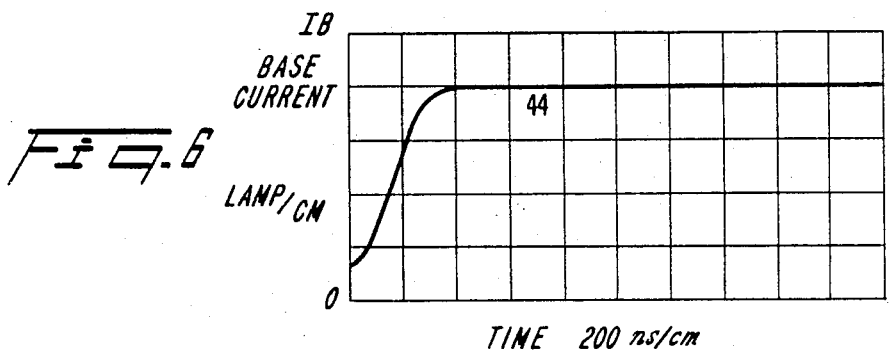
FIG. 6 is a diagrammatic representation of base drive current when the constant current source base driver is used and low output power is required.
Figure 7:
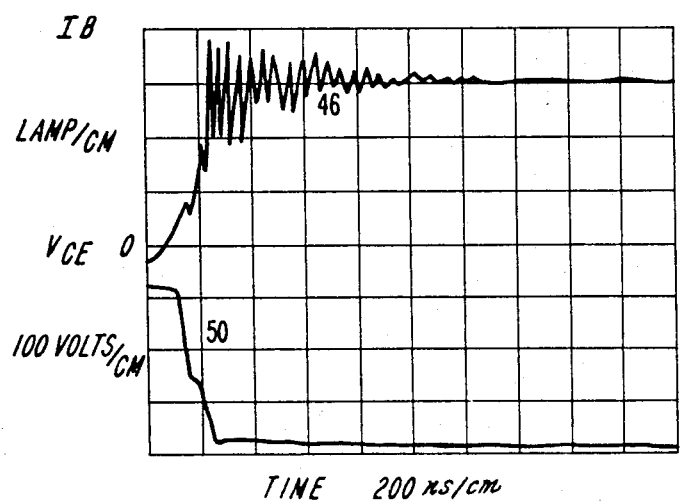
FIG. 7 is a diagrammatic representation of base drive current and collective-emitter voltage, during turn on response, when a constant current source base drive is used and output power of approximately 1 kw is required.

FIGS. 6 and 7 are diagrammatic representations of the constant current base driver's performance. For ease of comparison, FIGS. 6 and 7 are of the same scale as FIGS. 2 and 3, which represent turn "on" response of the prior art voltage source driver. Curve 44 shows base drive current turn "on" response for the current source drive. Comparison of curve 44 with the prior art response curve 20 shows that the current driver achieves superior response even at low output power, with three amps being obtained in about 300 nanoseconds as opposed to 1,200 nanoseconds for the prior art. The dramatic difference between the prior art drive method and the current source drive method can be seen when the power transistor is delivering high power. Curve 46 shows the base current drive response and curve 50 shows the collector-emitter voltage response during turn "on" when there is a high power condition. The current source driver forces base current to rise abruptly (see curve 46) despite reaction of the fast rise collector-emitter current which is evidenced by ringing in the base current. Comparing curve 46 with curve 22 shows that the current drive circuit, by forcing the base current, can achieve three amps current drive in 300 nanoseconds (its same time response as with low load) whereas, the prior art drive requires 1,600 nanoseconds to achieve the same three amp base current level. Curve 50 shows the collector-emitter voltage turn "on" response when there is a high power condition. The clean fall of the collector-emitter voltage (see curve 50) is evidence of much reduced switching losses. Curve 50 does not show the severe "hesitation" and resulting losses associated with the prior art voltage drive circuit (see curve 24). Thus, the constant current driver produces quick response and reduced switching losses not before possible with the prior art driver methods.

Figure 8:
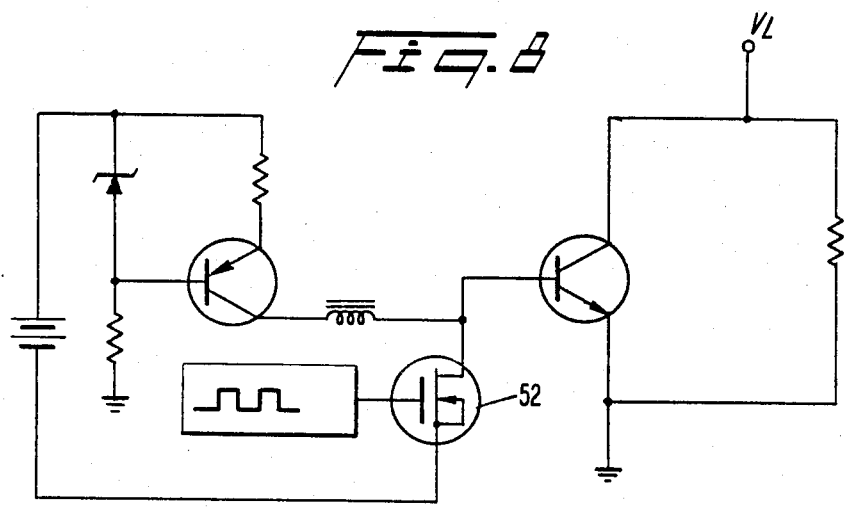
FIG. 8 is the schematic of the constant current source base drive circuit using a MOSFET for the "steering" function.

Once the current source concept has been made apparent further refinements of its embodiment are possible. One such alternative embodiment is shown in FIG. 8. In this circuit a MOSFET 52 is substituted for the steering transistor 40 (FIG. 5). Since MOSFET devices can switch about ten times faster than bipolar transistors, this modification would be useful if an even higher rate of rise of base drive current were required.

Figure 9:
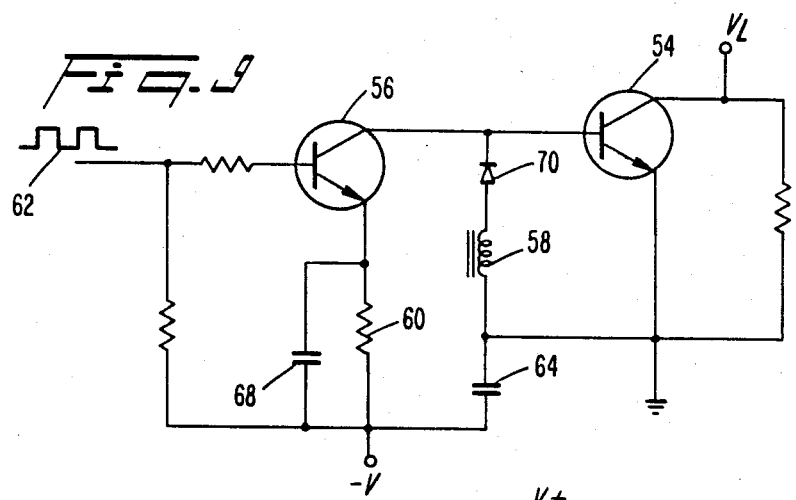
FIG. 9 is a schematic of a simplified current source direct base drive in which a single transistor provides both constant current and "steering" functions.

Another refinement is the combination of the constant current function of transistor 36 (see FIG. 5) and the current steering function of transistor 40 into a single transistor circuit. This simplified embodiment using one transistor, shown in FIG. 9, would have application when lower power is required and when the duty cycle range need only be from the zero percent to approximately 80 percent range. Power switching transistor 54 is biased "off" during the time interval when the driver transistor 56 is "on". During driver transistor's 56 "on" period it operates in its linear mode and sets the level of current in the base drive inductor 58 by "sensing" the voltage across resistor 60 and controlling this voltage drop to match the referenced potential established at the driving transistor 56 base to within one base-emitter forward biased junction potential. To abruptly switch power transistor 54 "on" the driver transistor 56 is switched "off". This forces the current in the base drive inductor 58 to flow to the base of the power transistor, effectively "swamping out" the much smaller, previously discussed, transient effects. Of course, continuous "on" base drive is no longer possible with this simplified circuit, since the energy storage in the base drive inductor has limits. When the driving transistor 56 is turned back "on" by the square wave control signals 62, the base current to the power transistor 54 is terminated and a low-impedance path for this current is provided through capacitors 68, 64, and through the driver transistor 56. During this interval the P-N junction drop across diode 70 provides additional reversed bias to assure fast switch off of the power transistor 54.

Figure 10:
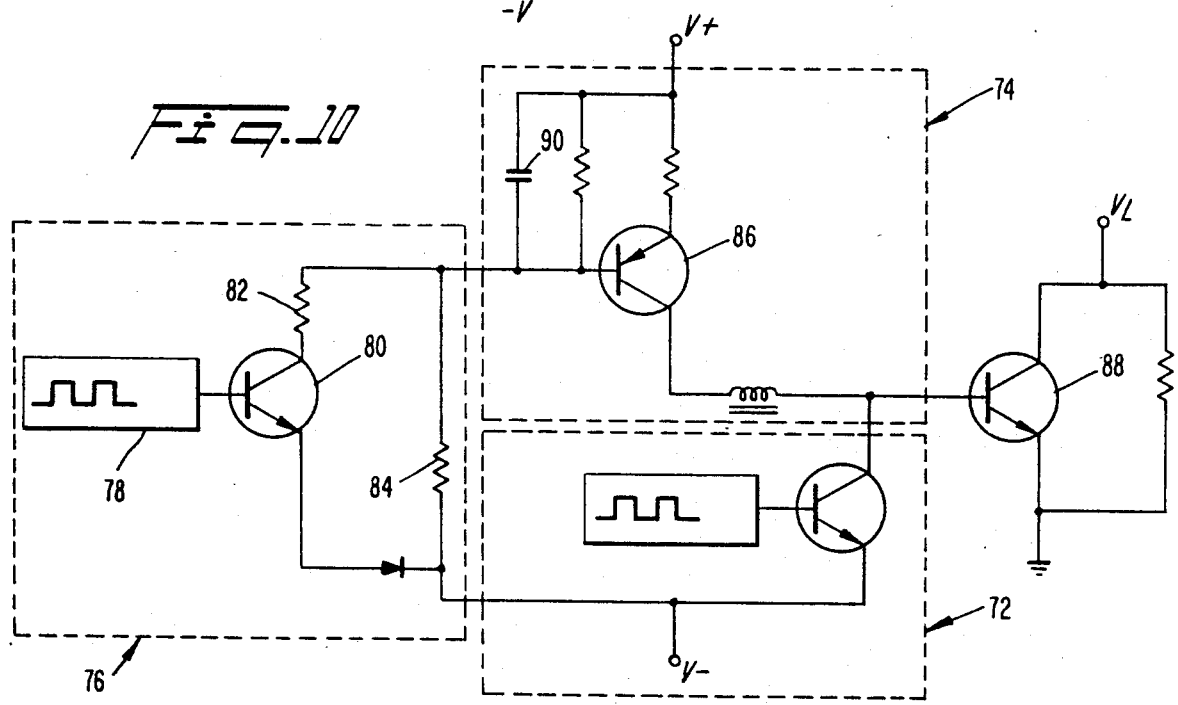
FIG. 10 is a schematic of a "programmed" current source base drive circuit.

An additional novel feature of the current base drive is that it enables easy programming of the base current amplitude. By controlling the bias of the transistor current source through simple means, one can set the amplitude of the base drive current to be responsive to various quantities, such as, duty cycle or collector current. For example, FIG. 10 shows the simplified embodiment in which the base drive circuit is "programmed" to be linearly proportional to the duty cycle. Since it is known that the power transistor current drive requirements increase with duty cycle, it is advantageous to program drive current amplitude as a function of duty, providing a selected minimum drive at nearly zero duty and increasing smoothly as the duty is increased. This programming prevents overdriving of the power transistor, thereby increasing efficiency and switching speed. The programmed driver, shown in FIG. 10, has a steering circuit 72, a current source circuit 74, and a programming circuit 76, which controls the bias voltage to the transistor current source. Rectangular wave signals are generated in a control circuit 78, which senses the duty cycle, and are fed to the base of transistor 80. Transistor 80 acts as an "on-off" switch alternately connecting and disconnecting resistor 82 in parallel connection with resistor 84. The average resistance of the combination of resistor 82 and resistor 84 determines the voltage at the base of transistor 86, thereby, controlling the amplitude of the base drive current to the power transistor 88. Capacitor 90 filters the control signal at the base of transistor 86 so that the current output of transistor 86 is the average response to the currents being drawn through resistor 82 and resistor 84. At near zero duty, transistor 80 is "off" the majority of the time, hence, resistor 84 is selected to set the minimum base drive current level. At near unity duty, transistor 80 is switched "on" the majority of the time by the rectangular wave control signals 78, hence, the value of resistor 82 is selected so that, in parallel with resistor 84, current source transistor 86 is biased to provide the maximum base drive required. In this way a programmed base drive is obtained which adjusts base current amplitude to match the requirements of the power transistor.

What is claimed is:

1. A "programmed" direct drive circuit, for power transistor operated in a non-linear "on-off" mode comprising:
    a current source including a base drive inductor for providing current to the base of said power transistor, said base drive inductor forcing an essentially constant current into said base thereby forcing said power transistor into "on" mode saturation;
    a programming circuit, connected to the current source, which adjusts the current amplitude produced by said current source to match the requirements of said power transistor;
    a reverse biasing low voltage supply; and,
    a control steering means connected from the base of said power transistor and the output of said constant current source to said reverse biasing low voltage supply, said control steering means and said reverse biasing low voltage supply connected independent of the emitter of said power transistor, said control steering means directing current from said constant current source either into said power transistor producing its "on" state or away from said power transistor through said reverse biasing low voltage supply creating an "off" state, said reverse biasing low voltage supply putting reverse bias on said base of said power transistor.

2. The apparatus in claim 1 in which said programming circuit comprises:
    a bias circuit for controlling the bias voltage to said current transistor, containing a first and second resistor in parallel connection between the low voltage source and the base of said current transistor, and also having a capacitor connected between the base of said current transistor and the opposite terminal of the low voltage to filter said base control voltage;
    a transistor switch, connected in series with said first resistor, such that in its "on" state said first and second resistor are in parallel and in its "off" state said first resistor is disconnected from said bias circuit;
    a control circuit connected to said transistor switch, which turns "on" or "off" said transistor switch, in response to some base drive inductor forcing current into said base thereby driving said power transistor into "on" mode saturation.

3. A simplified base drive circuit for a power transistor operated in a non-linear "on-off" mode, comprising:
    a base drive inductor connected between the base and emitter of said power transistor;
    a driving transistor circuit connected to said driver inductor and the base of said power transistor for developing the base current in said drive inductor during said driving transistor circuit's "on" mode and for releasing a sudden flow of current from said driver inductor during said driving transistor circuit's "off" mode to force current into said power transistor base thereby turning it on;
    a reverse biasing voltage source;
    a low impedance circuit connected to said reverse biasing voltage source and said driving transistor, said low impedance circuit providing a low impedance path for base current when said power transistor is turned off;
    said reverse biasing voltage source connected through said low impedance path and said driving transistor to place a reverse bias voltage on the base of said power transistor.

4. The apparatus of claim 3 in which said low impedance circuit includes a first capacitor connected between said reverse biasing voltage source and said driving transistor for providing a low impedance path for said power transistor base current when said driving transistor turns on to turn off said power transistor.

5. The apparatus of claim 4 in which said low impedance circuit further includes a second capacitor between said reverse biasing voltage source and the junction of said base drive inductor and the emitter of said power transistor, said second capacitor stabilizing the reverse biasing voltage source at a voltage negative with respect to said power transistor emitter voltage during the turn on and turn off cycles of said power transistor and driving transistor.

* * * * *